(12) United States Patent
Oba et al.

(10) Patent No.: US 10,811,458 B2
(45) Date of Patent: Oct. 20, 2020

(54) METHOD OF PROCESSING WAFER

(71) Applicant: DISCO CORPORATION, Tokyo (JP)

(72) Inventors: Ryugo Oba, Tokyo (JP); Yukinobu Ohura, Tokyo (JP); Hideyuki Sandoh, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 10 days.

(21) Appl. No.: 16/151,903

(22) Filed: Oct. 4, 2018

(65) Prior Publication Data

US 2019/0109173 A1    Apr. 11, 2019

(30) Foreign Application Priority Data

Oct. 6, 2017    (JP) ................. 2017-196126

(51) Int. Cl.

| | |
|---|---|
| *H01L 27/146* | (2006.01) |
| *H01L 21/78* | (2006.01) |
| *H01L 21/683* | (2006.01) |
| *H01L 23/544* | (2006.01) |
| *H01L 21/308* | (2006.01) |
| *H01L 21/3065* | (2006.01) |
| *H01L 21/67* | (2006.01) |

(52) U.S. Cl.
CPC ...... *H01L 27/14687* (2013.01); *H01L 21/308* (2013.01); *H01L 21/3065* (2013.01); *H01L 21/3081* (2013.01); *H01L 21/6715* (2013.01); *H01L 21/67051* (2013.01); *H01L 21/67092* (2013.01); *H01L 21/67132* (2013.01); *H01L 21/6836* (2013.01); *H01L 21/78* (2013.01); *H01L 23/544* (2013.01); *H01L 27/14632* (2013.01); *H01L 2221/6834* (2013.01); *H01L 2221/68327* (2013.01); *H01L 2223/5446* (2013.01)

(58) Field of Classification Search
None
See application file for complete search history.

(56) References Cited

U.S. PATENT DOCUMENTS

| | | | | |
|---|---|---|---|---|
| 2014/0273401 | A1* | 9/2014 | Lei ................. | H01L 21/30655 438/462 |
| 2015/0255400 | A1* | 9/2015 | Chou ............... | H01L 23/544 438/424 |
| 2018/0342422 | A1* | 11/2018 | Li .................. | H01L 21/02076 |

FOREIGN PATENT DOCUMENTS

JP    2001127011 A    5/2001

* cited by examiner

*Primary Examiner* — Steven M Christopher (74) *Attorney, Agent, or Firm* — Greer Burns & Crain Ltd.

(57) ABSTRACT

A method of processing a wafer having devices disposed in respective regions demarcated on a front face thereof by a grid of a plurality of projected dicing lines on the front face, the method includes a mask layer forming step of covering the front face of the wafer except for the regions where grooves are to be formed along the projected dicing lines with a resin material mixed with an ultraviolet ray absorber, and forming a mask layer on the front face of the wafer, a plasma etching step of performing plasma etching on the wafer from the mask layer side using a fluorine-based stable gas as an etching gas, and forming grooves in the wafer along the projected dicing lines, and a mask layer removing step of removing the mask layer after the plasma etching step is performed.

17 Claims, 7 Drawing Sheets

METHOD OF PROCESSING WAFER

BACKGROUND OF THE INVENTION

Field of the Invention

The present invention relates to a method of processing a wafer to divide the wafer into individual device chips.

Description of the Related Art

A semiconductor wafer with each of devices disposed in each of regions demarcated by a grid of a plurality of projected dicing lines is usually divided into individual device chips by a dicing saw or a laser processing apparatus. The dicing saw has problems in that it tends to produce chippings from the semiconductor wafer being cut through as the dicing process is a fracturing process, the divided device chips are likely to be low in flexural strength, and the dicing process performed using the dicing saw is relatively time-consuming. Though the laser processing apparatus is advantageous because it produces less chippings and essentially no debris from the semiconductor wafer being processed with the laser beam, it is also problematic in that, since adjacent ones of divided device chips are closely positioned, they are likely to rub against each other and produce chippings when subsequently delivered.

To solve the above problems, there has been proposed a processing method based on plasma dicing for dividing wafers into individual device chips using plasma etching (see, for example, Japanese Patent Laid-open No. 2001-127011). According to plasma dicing, the regions of a wafer other than projected dicing lines on the wafer, i.e., the regions where devices are disposed, are protected by a protective film, and the projected dicing lines are subjected to plasma etching, thereby dividing the wafer into individual device chips. The proposed processing method is advantageous in that even when a wafer having a larger diameter is processed, the period of time required to form grooves in the wafer along the projected dicing lines remains unchanged, making it possible to produce device chips of high flexural strength.

SUMMARY OF THE INVENTION

For performing plasma etching on a wafer, the wafer is introduced into a predetermined chamber, and then, an etching gas is supplied to the wafer in the chamber, and a high-frequency voltage is applied in the chamber to convert the etching gas into plasma, which form grooves in the wafer along projected dicing lines thereon. It has become clear that, although the devices are protected by the protective film, the devices may possibly be damaged by ultraviolet rays emitted when the etching gas is plasmatized during the plasma etching process.

It is therefore an object of the present invention to provide a method of processing a wafer while preventing devices on the wafer from being damaged during a plasma etching process.

In accordance with an aspect of the present invention, there is provided a method of processing a wafer having devices disposed in respective regions demarcated on a front face thereof by a grid of a plurality of projected dicing lines on the front face. The method includes a mask layer forming step of covering the front face of the wafer except for the regions where grooves are to be formed along the projected dicing lines with a material mixed with an ultraviolet ray absorber, and forming a mask layer on the front face of the wafer, a plasma etching step of performing plasma etching on the wafer from the mask layer side using a fluorine-based stable gas as an etching gas, and forming grooves in the wafer along the projected dicing lines, and a mask layer removing step of removing the mask layer after the plasma etching step is performed. The ultraviolet ray absorber absorbs ultraviolet rays emitted when the etching gas is plasmatized thereby to protect the devices from the ultraviolet rays.

With the above configuration, since the ultraviolet rays emitted when the etching gas is plasmatized are absorbed by the ultraviolet ray absorber mixed with the mask layer, the devices can be protected from the ultraviolet rays and hence can be prevented from being damaged when plasma etching is performed on the wafer.

Preferably, the mask layer may be a water-soluble protective film in which a water-soluble liquid resin is mixed with the ultraviolet ray absorber, and in the mask layer removing step, the mask layer is removed with cleaning water. With this configuration, the mask layer can easily be formed and removed.

Preferably, the ultraviolet ray absorber may be in the form of fine particles of an oxide or a nitride. Alternatively, the ultraviolet ray absorber may be in the form of a water-soluble ultraviolet ray absorber. With this configuration, the ultraviolet ray absorber can easily be mixed with the mask layer.

Preferably, in the mask layer forming step, after the front face of the wafer is covered with the material, a laser beam having a wavelength that is absorbable by the wafer and the material is applied to the wafer along the projected dicing lines to remove the material along the projected dicing lines.

Preferably, the devices may be image sensors. The image sensors that detect light and output signals commensurate with the amount of detected light can be protected from the ultraviolet rays and can be effectively prevented from being damaged when plasma etching is performed on the wafer.

According to the present invention, since the ultraviolet ray absorber mixed with the mask layer absorbs ultraviolet rays emitted when the etching gas is plasmatized, the devices can be protected from the ultraviolet rays and hence can be prevented from being damaged when plasma etching is performed on the wafer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will be described in detail below with reference to the drawings. The present invention is not limited to the embodiment to be described below. The components described below cover those which could easily be conceived by those skilled in the art and those which are substantially identical to those described below. Furthermore, configurations described below can be used in appropriate combinations. Various omissions, replacements, or changes of the configurations may be made without departing from the scope of the present invention.

Figure 1:
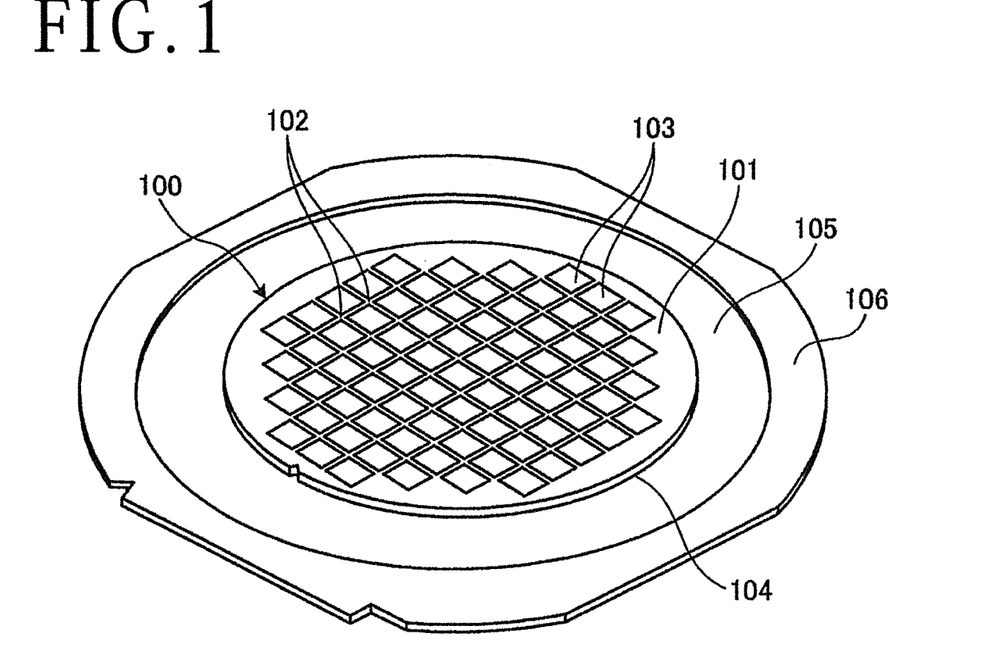
FIG. 1 is a perspective view of a wafer to be processed.
Figure 2:
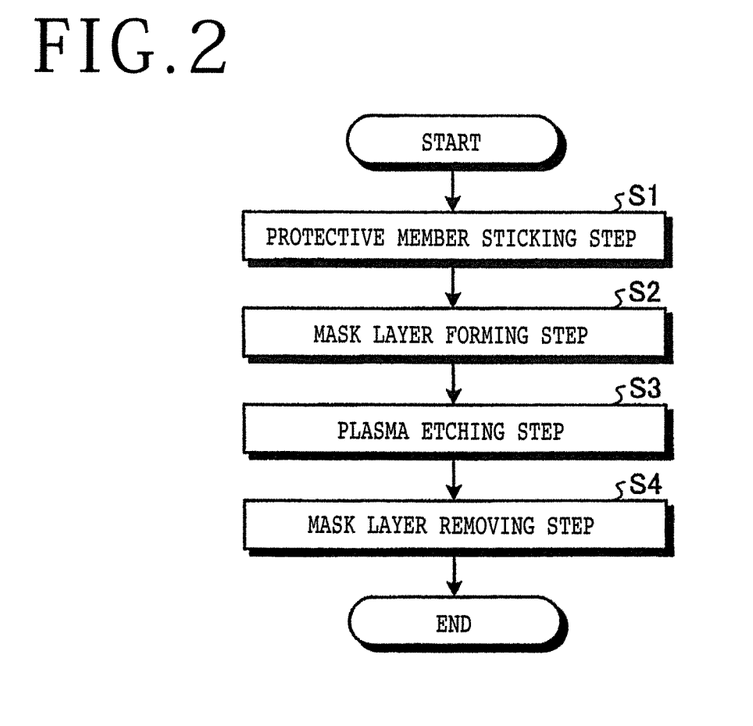
FIG. 2 is a flowchart of a processing sequence of a method of processing a wafer according to the present invention.

A method of processing a wafer according to the present embodiment will be described below with reference to the drawings. FIG. 1 is a perspective view of a wafer to be processed, and FIG. 2 is a flowchart of a processing sequence of the method of processing a wafer according to the present embodiment. In the present embodiment, a wafer 100 to be processed is a disk-shaped semiconductor wafer made of a base material of silicon or an optical device wafer made of a base material of sapphire, silicon carbide (SiC), or the like. As illustrated in FIG. 1, the wafer 100 has a plurality of devices 103 disposed in respective regions demarcated on a front face 101 thereof by a grid of projected dicing lines 102 on the front face 101.

The wafer 100 has a diameter of 300 mm, for example, and each of the devices 103 is of a square shape having four sides each substantially 5 mm long. The devices 103 may be image sensors such as charge coupled devices (CCDs), complementary metal oxide semiconductors (CMOSs), or the like. The wafer 100 is supported on an annular frame 106 by a dicing tape or protective member 105 stuck to a back face 104 of the wafer 100.

The method of processing a wafer according to the present embodiment is a method of manufacturing device chips, not depicted, by cutting the wafer 100 along the projected dicing lines 102 to divide or separate the wafer 100 into a plurality of individual device chips. As illustrated in FIG. 2, the method includes a protective member sticking step S1, a mask layer forming step S2, a plasma etching step S3, and a mask layer removing step S4.

Figure 3:
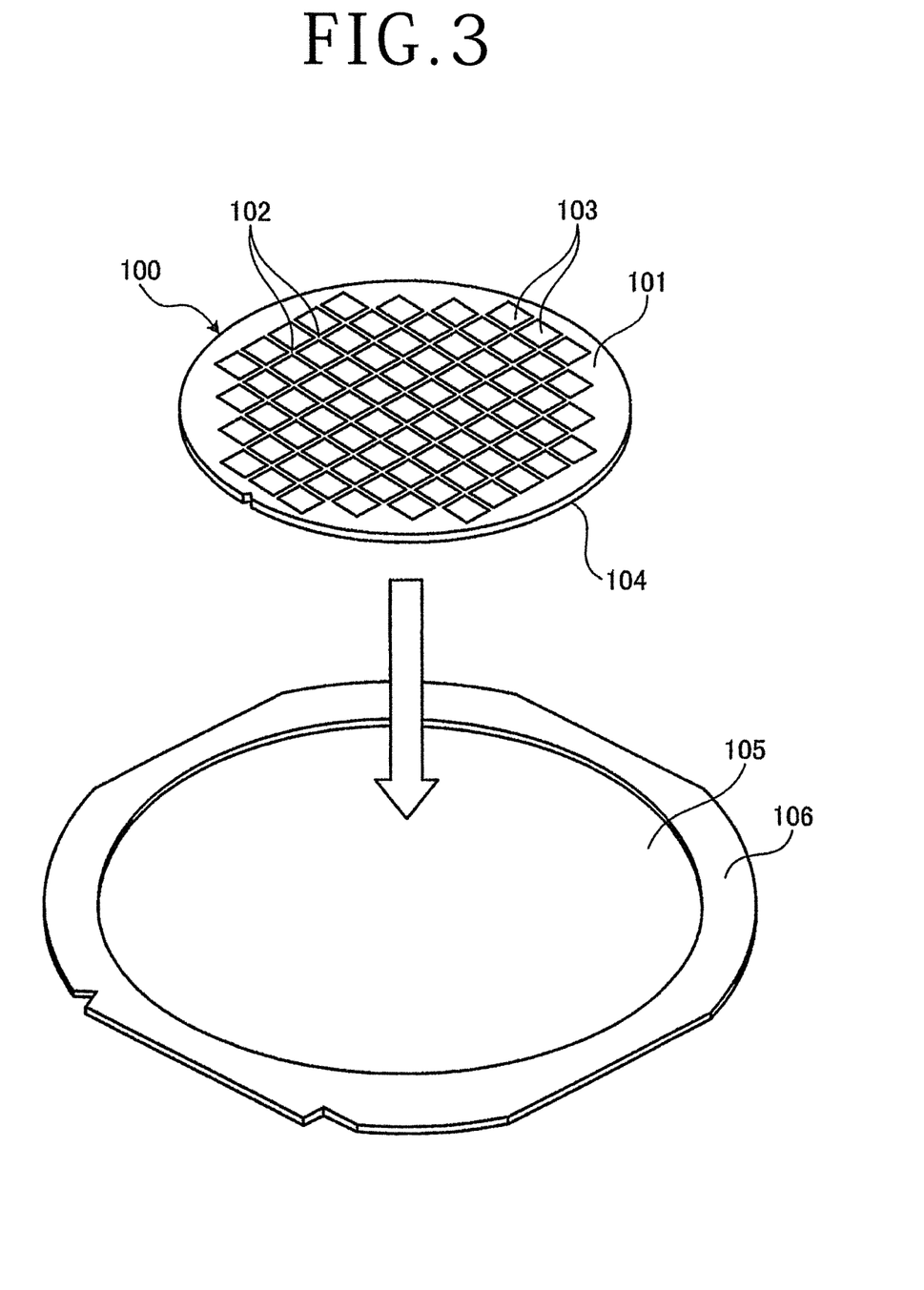
FIG. 3 is a perspective view illustrating a protective member sticking step of the method of processing a wafer.

The protective member sticking step S1 is a step of sticking a dicing tape 105 as a protective member to the back face 104 of the wafer 100. According to the present embodiment, as illustrated in FIG. 3, the back face 104 of the wafer 100 is placed in facing relation to the dicing tape 105 with the annular frame 106 stuck to an outer peripheral edge portion thereof. Then, as illustrated in FIG. 1, the back face 104 of the wafer 100 is stuck to the dicing tape 105.

Figure 4:
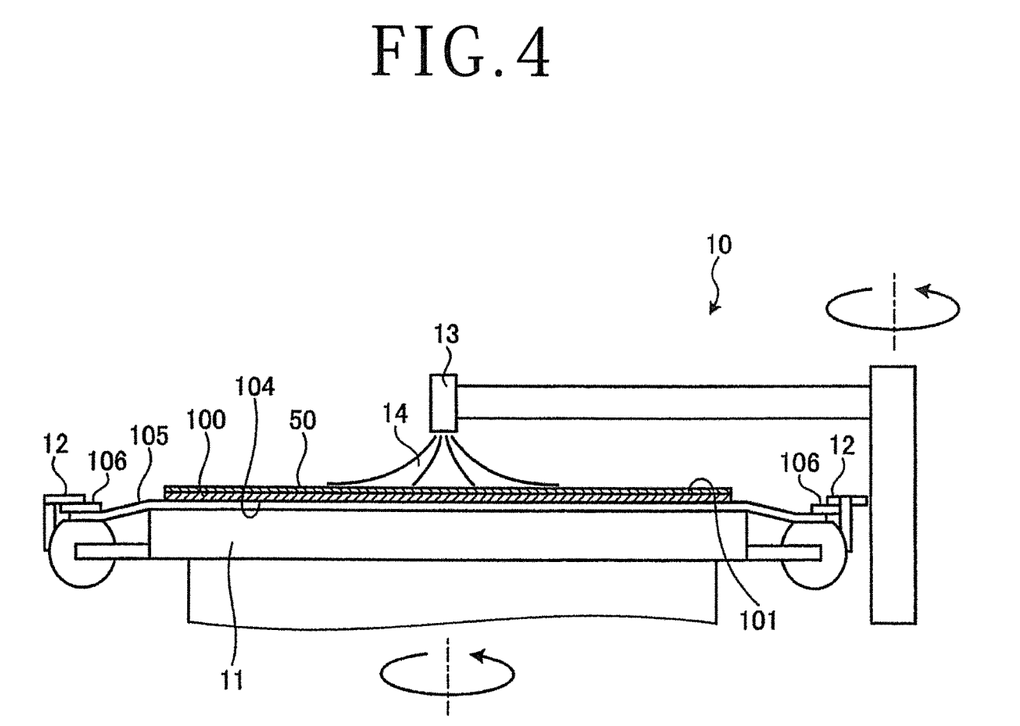
FIG. 4 is a sectional side elevational view illustrating a former stage of a mask layer forming step of the method of processing a wafer.

The mask layer forming step S2 is a step of forming a mask layer 50 (see FIG. 4) of a material mixed with an ultraviolet ray absorber that absorbs ultraviolet rays, in covering relation to the front face 101 of the wafer 100 except for regions thereof that correspond to the projected dicing lines 102. The mask layer forming step S2 includes a former stage in which the mask layer 50 covers the front face 101 of the wafer 100 in its entirety and a latter stage in which the mask layer 50 is removed from regions of the front face 101 that correspond to the projected dicing lines 102. In the former stage of the mask layer forming step S2, as illustrated in FIG. 4, the back face 104 of the wafer 100 is held under suction on a spinner table 11 of a spin coater 10 through the dicing tape 105, and the annular frame 106 is clamped in position by a plurality of clamps 12. Then, the spinner table 11 rotates about its own central axis, and a coating nozzle 13 drops a liquid resin 14 onto a central portion of the front face 101 of the wafer 100. The dropped liquid resin 14 flows radially outwardly over the front face 101 of the wafer 100 from a central portion thereof under centrifugal forces generated by the rotation of the spinner table 11, and spreads all over the front face 101 of the wafer 100. Thereafter, the spinner table 11 continues to rotate to deposit the liquid resin 14 to a predetermined thickness on the front face 101 of the wafer 100 and to dry the liquid resin 14 on the rotating spinner table 11. If necessary, the liquid resin 14 deposited on the front face 101 of the wafer 100 is hardened by baking, for example, to form a mask layer 50 covering the entire front face 101.

The liquid resin 14 may be, for example, a water-soluble liquid resin such as polyvinyl pyrrolidone (PVP), polyvinyl alcohol (PVA), or the like. An ultraviolet ray absorber that absorbs ultraviolet rays has been dispersed in and mixed with the liquid resin 14. The ultraviolet ray absorber may be in the form of fine particles of at least one metal oxide selected from titanium oxide ($TiO_2$), iron oxide (III) ($Fe_2O_3$), zinc oxide (ZnO), cerium oxide (IV) ($CeO_2$), copper oxide (I) ($Cu_2O$), copper oxide (II) (CuO), magnesium oxide (MgO), and so on, for example. According to the present embodiment, titanium oxide ($TiO_2$), for example, is selected as the ultraviolet ray absorber. The fine particles of the metal oxide have an average diameter adjusted in a range from 10 to 50 [nm], and the concentration of the metal oxide with respect to the liquid resin 14 is in a range from substantially 1 to 10 [%], for example, preferably in a range from 2 to 5 [%].

Figure 5:
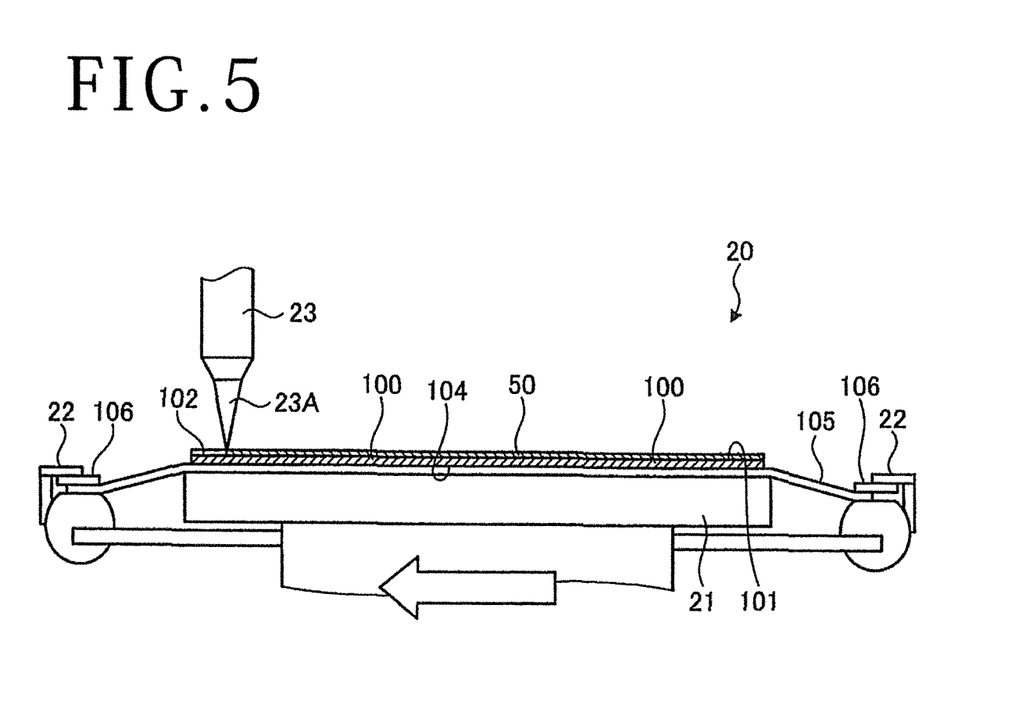
FIG. 5 is a sectional side elevational view illustrating a latter stage of the mask layer forming step of the method of processing a wafer.

Then, in the latter stage, a laser beam 23A (see FIG. 5) is applied to the wafer 100 from the front face 101 side covered in its entirety with the mask layer 50 along the projected dicing lines 102, removing those regions of the mask layer 50 over and along the projected dicing lines 102 through an ablation process. Specifically, as shown in FIG. 5, the back face 104 of the wafer 100 is held under suction on a chuck table 21 of a laser processing apparatus 20, and the annular frame 106 is clamped in position by a plurality of clamps 22. Then, an infrared camera, not shown, of the laser processing apparatus 20 captures an image of the front face 101 of the wafer 100, and the positions of the projected dicing lines 102 are determined from the captured image. Thereafter, while laser beam applying means 23 and the chuck table 21 are being moved relatively to each other along the projected dicing lines 102, the laser beam applying means 23 applies the laser beam 23A to the wafer 100 along the projected dicing lines 102 (ablation process).

The ablation process described above is carried out under the processing conditions given below, for example. The laser beam 23A has a wavelength that is absorbable by both the wafer 100 and the liquid resin 14. The processing conditions given below are examples only and are not restrictive.

Figure 6:
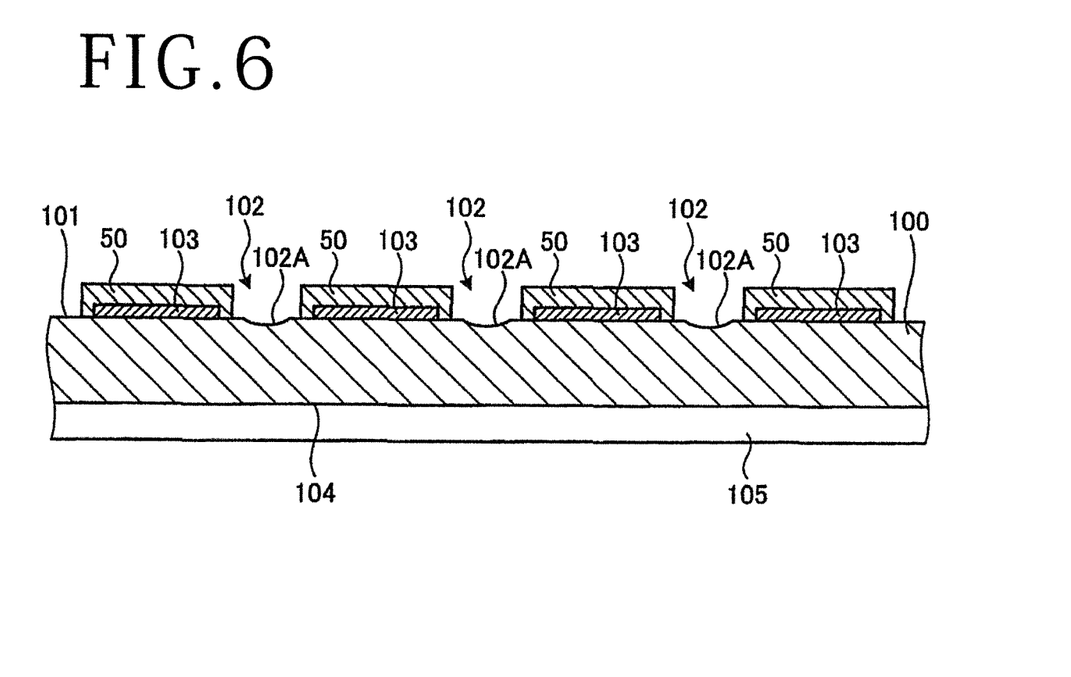
FIG. 6 is an enlarged fragmentary sectional side elevational view of the wafer with a mask layer formed thereon.

Processing Conditions:
  Light source: YAG pulsed laser or YVO4 pulsed laser
  Wavelength: 355 nm
  Average output power: 0.5 W
  Repetitive frequency: 200 kHz
  Beam spot diameter: 10 μm
  Chuck table feed speed: 100 mm/s The ablation process performed under the above processing conditions removes the regions of the mask layer 50 that correspond to the projected dicing lines 102, leaving the mask layer 50 in the regions including the devices 103, as illustrated in FIG. 6. In this manner, the mask layer 50 in the form of a water-soluble protective film is formed as an etching mask on the front face 101 of the wafer 100. In the ablation process, surface layer portions 102A of the projected dicing lines 100 in the front face 101 of the wafer 100 may also be removed together with the mask layer 50. Some types of wafers may include test element groups (TEGs) disposed on the projected dicing lines 102 as devices for assessing the devices 103. Since the TEGs are made of metal, they may possibly act as masks in the plasma etching step S3 to be described below. When the surface layer portions 102A of the projected dicing lines 102 are removed in the ablation process, the TEGs that may have been disposed on the surface layer portions 102A are also removed, so that plasma etching will effectively be carried out.

Figure 7:
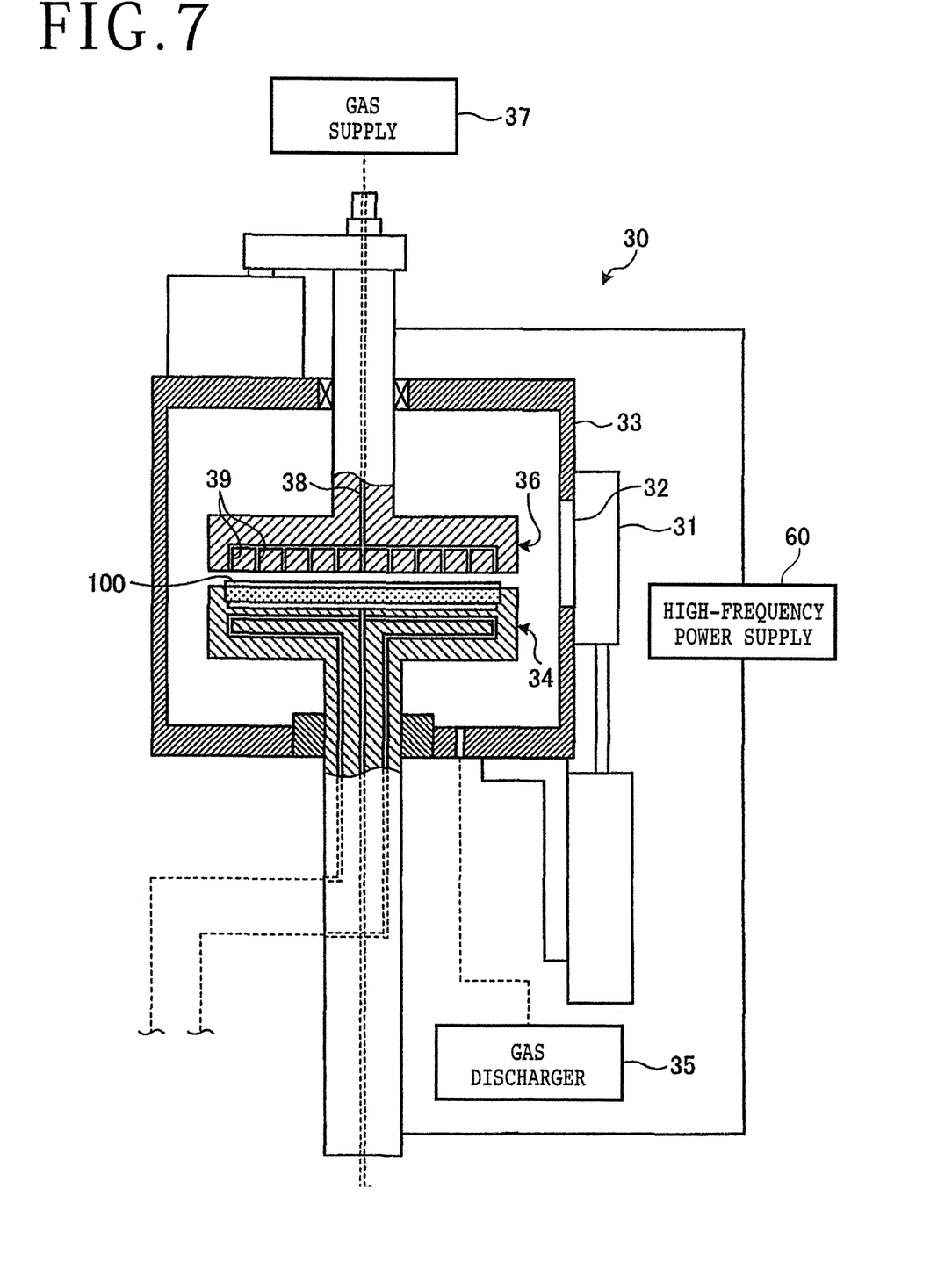
FIG. 7 is a cross-sectional view illustrating by way of example a plasma etching apparatus that is used in a plasma etching step of the method of processing a wafer.

The plasma etching step S3 is a step of performing plasma etching on the wafer 100 covered with the mask layer 50 from the front face 101 side of the wafer 100. In the plasma etching step S3, the regions of the front face 101 that correspond to the projected dicing lines 102 from which the mask layer 50 has been removed are etched away, dividing the wafer 100 into individual device chips (chips) 110. Specifically, the plasma etching step S3 is carried out as follows: a shutter 31 of a plasma etching apparatus 30 illustrated in FIG. 7 is lowered to open an opening 32 in a chamber 33, and the wafer 100 is introduced through the opening 32 into the chamber 33. In the chamber 33, the wafer 100 with the front face 101 exposed upwardly in FIG. 7 is placed on and electrostatically attracted to a chuck table 34. Then, the shutter 31 is elevated to close the opening 32, and the chamber 33 is evacuated to a reduced pressure by a gas discharger 35.

Figure 8:
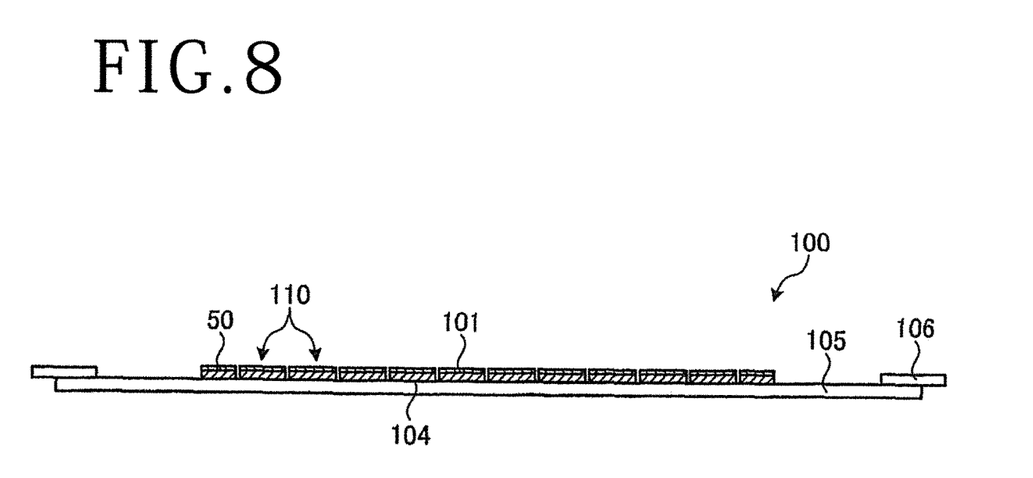
FIG. 8 is a sectional side elevational view illustrating the wafer etched in the plasma etching step.
Figure 9:
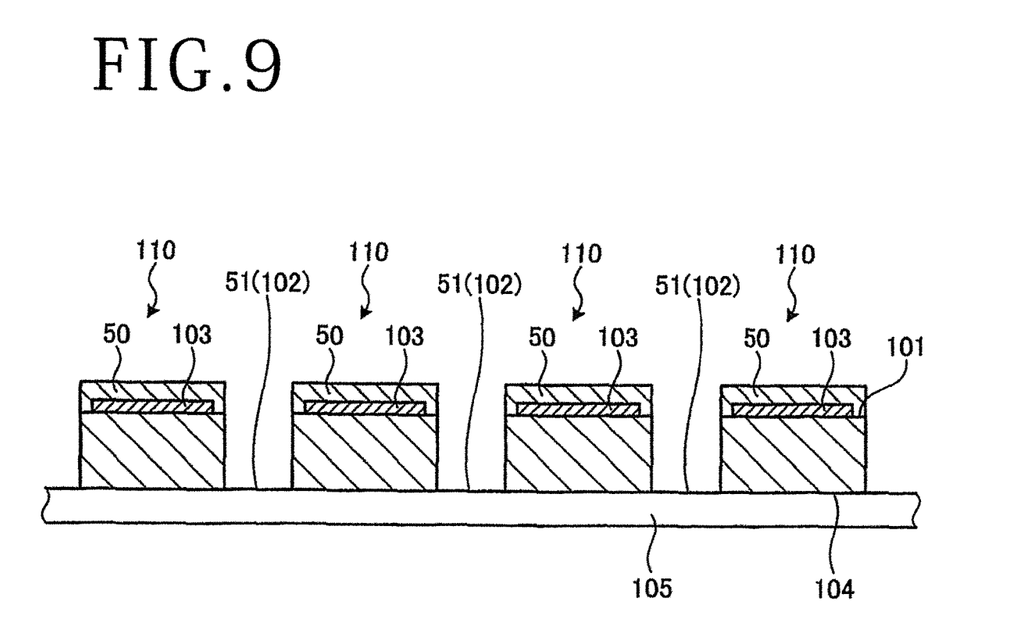
FIG. 9 is an enlarged fragmentary sectional side elevational view of the wafer with grooves formed therein by plasma etching.

Then, etching gas supply means 36 is lowered over the wafer 100, and a gas supply 37 supplies a fluorine-based stable gas as an etching gas into a gas channel 38 defined in the etching gas supply means 36. The etching gas is ejected into the chamber 33 from ejection ports 39 defined in a lower surface portion of the etching gas supply means 36 and connected to the gas channel 38. A high-frequency power supply 60 then applies a high-frequency voltage between the etching gas supply means 36 and the chuck table 34 to convert the etching gas into plasma. A bias voltage is applied to the wafer 100 to bring ions in the plasma into the front face 101 of the wafer 100 to etch the wafer 100. As shown in FIG. 8, the wafer 100 is now etched thicknesswise from the front face 101 to the back face 104. Specifically, as shown in FIG. 9, the regions of the front face 101 which are not covered with the mask layer 50, i.e., that correspond to the projected dicing lines 102, and the regions of the wafer 100 beneath those regions of the front face 101 are etched away, forming grooves 51 down to the back face 104 in the wafer 100 thereby to divide the wafer 100 into individual device chips 110.

According to the present embodiment, a fluorine-based stable gas such as sulfur hexafluoride ($SF_6$) or carbon tetrafluoride ($CF_4$) is used as the etching gas. Alternatively, a fluorine-based stable gas of at least one of ethane hexafluoride ($C_2F_6$), tetrafloroethylene ($C_2F_4$), trifluoromethane ($CHF_3$), and so on may be used as the etching gas.

Figure 10:
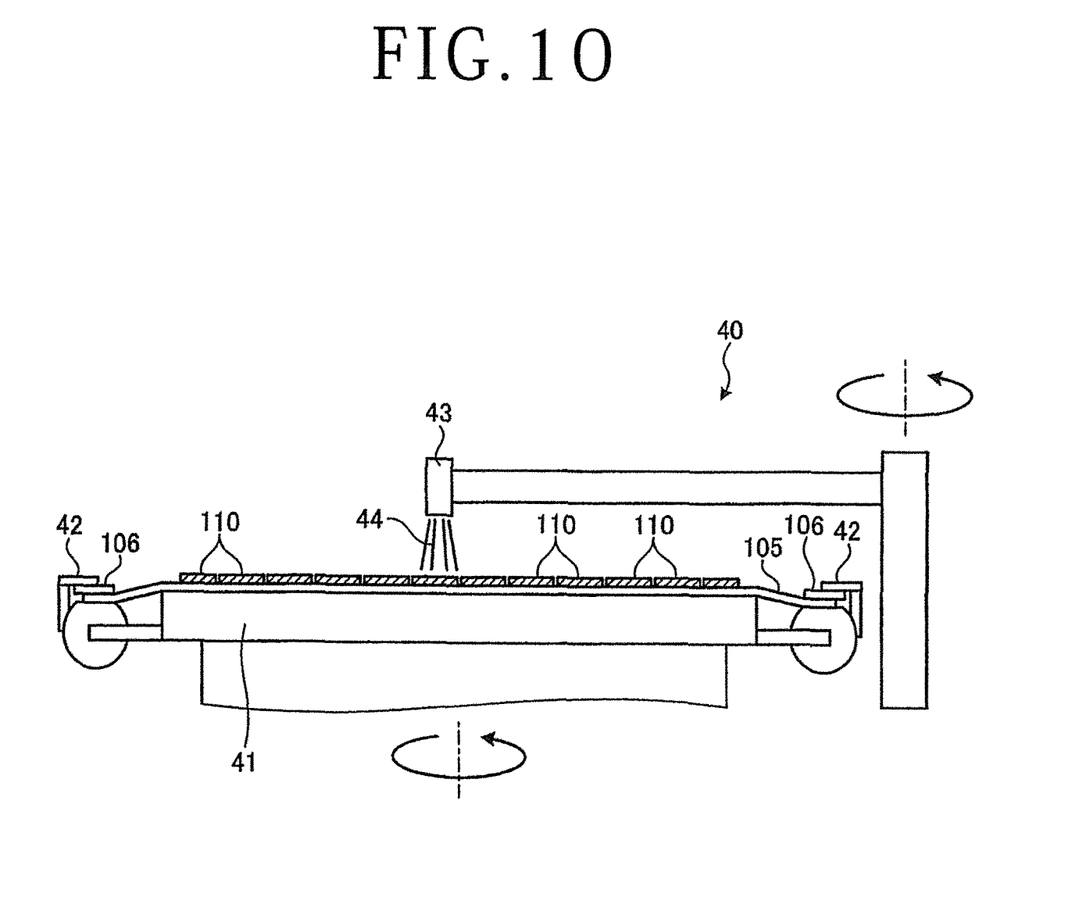
FIG. 10 is a sectional side elevational view illustrating a mask layer removing step of the method of processing a wafer.

The mask layer removing step S4 is a step of removing the mask layer 50 that covers mainly the devices 103. In the mask layer removing step S4, as illustrated in FIG. 10, the back face 104 of the wafer 100, i.e., respective back faces of the device chips 110, is held under suction on a spinner table 41 of a cleaning apparatus 40 through the dicing tape 105, and the annular frame 106 is clamped in position by a plurality of clamps 42. Then, the spinner table 41 rotates about its own central axis, and a cleaning nozzle 43 supplies cleaning water 44 to a central portion of the front face 101 of the wafer 100, i.e., respective front faces of the device chips 110. The supplied cleaning water 44 flows radially outwardly over the front faces of the device chips 110 from the central portion of the front face 101 of the wafer 100 under centrifugal forces generated by the rotation of the spinner table 41. The cleaning water 44 as it spreads all over the device chips 110 dissolves the mask layer 50 covering the front faces of the device chips 110, leaving the device chips 110 with their front faces exposed. Note that pure water may be used as the cleaning water 44, for example. Finally, the device chips 110 left on the dicing tape 105 are picked up, whereupon the mask layer removing step S4 comes to an end.

In a case in which a fluorine-based stable gas such as of sulfur hexafluoride ($SF_6$) or carbon tetrafluoride ($CF_4$) is used as the etching gas, then the etching gas emits ultraviolet rays or ultraviolet light as it is plasmatized. These ultraviolet rays are absorbed by the ultraviolet ray absorber mixed with the mask layer 50, and hence, the devices 103 can be protected against damage from the ultraviolet rays. Meanwhile, in a case in which the devices 103 are image sensors, they are more susceptible to damage from the ultraviolet rays than other devices such as integrated circuits (ICs), large-scale integration (LSI) circuits, or the like because the image sensors detect light and output signals commensurate with an amount of the detected light. According to the present embodiment, for example, polyvinyl pyrrolidone (PVP) is used as the liquid resin 14, a metal oxide of titanium oxide ($TiO_2$) is used as the ultraviolet ray absorber, and the concentration, i.e., weight % concentration, of the ultraviolet ray absorber with respect to the liquid resin 14 is in a range from substantially 1 to 10 [%], for example, preferably in a range from 2 to 5 [%]. Consequently, the image sensors or the devices 103 can be prevented from being damaged by the ultraviolet rays.

According to the present embodiment, as described above, the method of processing the wafer 100 having the devices 103 disposed in the respective regions demarcated on the front face 101 thereof by the grid of projected dicing lines 102 on the front face 101 includes the mask layer forming step S2 in which the front face 101 of the wafer 100 except for the regions where grooves 51 are to be formed along the projected dicing lines 102 is covered with a resin material mixed with the ultraviolet ray absorber, forming the mask layer 50 on the front face 101 of the wafer 100, the plasma etching step S3 in which plasma etching is performed on the wafer 100 from the mask layer 50 side using a fluorine-based stable gas as an etching gas, forming grooves 51 in the wafer 100 along the projected dicing lines 102, and the mask layer removing step S4 in which the mask layer 50 is removed after the plasma etching step S3. Since the ultraviolet ray absorber absorbs ultraviolet rays emitted when the etching gas is plasmatized thereby to protect the devices 103 from the ultraviolet rays, the devices 103 can be protected from the ultraviolet rays and hence can be prevented from being damaged when plasma etching is performed on the wafer 100.

According to the present embodiment, furthermore, the mask layer 50 is a water-soluble protective film made of a water-soluble liquid resin mixed with an ultraviolet ray absorber. In the mask layer removing step S4, the mask layer 50 is removed by the cleaning water 44. Therefore, the mask layer 50 can easily be formed and removed. According to the present embodiment, moreover, as the ultraviolet ray absorber may be in the form of fine particles of a metal oxide, the mask layer 50 can easily be mixed with the ultraviolet ray absorber.

According to the present embodiment, in the mask layer forming step S2, after the front face 101 of the wafer 100 has been covered with the resin material in which the water-soluble liquid resin is mixed with the ultraviolet ray absorber, the laser beam 23A that is absorbable by the wafer 100 and the resin material is applied to the wafer 100 along the projected dicing lines 102 to remove the mask layer 50 therealong. It is therefore easy to form the mask layer 50 that covers the front face 101 of the wafer 100 except for the regions thereof that correspond to the projected dicing lines 102.

According to the present embodiment, the devices 103 may be image sensors that detect light and output signals commensurate with the amount of detected light. The image sensors can be protected from the ultraviolet rays by the ultraviolet ray absorber and can be effectively prevented from being damaged when plasma etching is performed on the wafer 100.

Another embodiment of the present invention will be described below. In the above embodiment, fine particles of a metal oxide are used as the ultraviolet ray absorber. However, fine particles of a metal nitride may also be used as the ultraviolet ray absorber. Specifically, the ultraviolet ray absorber may be in the form of fine particles of at least one metal nitride selected from aluminum nitride (AlN), zirconium nitride (ZrN), hafnium nitride (HfN), hexagonal boron nitride (BN), titanium nitride (TiN), and so on, for example. The fine particles of the metal nitride have an average diameter adjusted in a range from 10 to 50 [nm], and a concentration of the metal nitride with respect to the liquid resin 14 is in a range from substantially 1 to 10 [%], for example, preferably in a range from 2 to 5 [%].

In addition, a water-soluble ultraviolet ray absorber may be used as the ultraviolet ray absorber. The water-soluble ultraviolet ray absorber may be at least one selected from 4,4'-dicarboxy benzophenone, benzophenone-4-carboxylic acid, 2-carboxy anthraquinone, 1,2-naphthalene dicarboxylic acid, 1,8-naphthalene dicarboxylic acid, 2,3-naphthalene dicarboxylic acid, 2,6-naphthalene dicarboxylic acid, 2,7-naphthalene dicarboxylic acid, and so on, their sodium salt, potassium salt, ammonium salt, quaternary ammonium salt, and so on, 2,6-anthraquinone disulfonic acid sodium salt, 2,7-anthraquinone disulfonic acid sodium salt, ferulic acid, and so on. The concentration of the metal nitride with respect to the liquid resin 14 is in the range from substantially 1 to 10 [%], for example, preferably in the range from 2 to 5 [%].

The present invention is not limited to the above described embodiment. Various changes and modifications may be made therein without departing from the scope of the present invention. For example, according to this embodiment, the mask layer 50 is formed by the spin coater from the resin material in which the water-soluble liquid resin is mixed with the ultraviolet ray absorber in the mask layer forming step. Alternatively, a sheet-like mask mixed with an ultraviolet ray absorber in advance may be stuck to the front face 101 of the wafer 100, and the regions of the sheet-like mask that correspond to the projected dicing lines 102 may be removed to form the mask layer 50. According to the present embodiment, in the plasma etching step S3, the wafer 100 is divided into the device chips 110 by the grooves 51 formed in the wafer 100 to the depth from the front face 101 to the back face 104 thereof by plasma etching. Alternatively, grooves may be formed in the wafer 100 to a desired depth from the front face 101, and then, the back face 104 may be ground until the grooves are exposed on the back face 104, thereby dividing the wafer 100 into the device chips 110.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having devices disposed in respective regions demarcated on a front face thereof by a grid of a plurality of projected dicing lines on the front face, the method comprising:

a mask layer forming step of covering the front face of the wafer with a water-soluble protective film in which a water-soluble liquid resin is mixed with an ultraviolet ray absorber to form a mask layer on the front face of the wafer and removing the mask layer in regions where grooves are to be formed along projected dicing lines, and wherein the ultraviolet ray absorber comprises at least one selected from 4,4'-dicarboxy benzophenone, benzophenone-4-carboxylic acid 2-carboxy anthraquinone, 1,2-naphthalene dicarboxylic acid, 1,8-naphthalene dicarboxylic acid, 2,3-naphthalene dicarboxylic acid, 2,6-naphthalene dicarboxylic acid, 2,7-naphthalene dicarboxylic acid, salts thereof, 2,6-anthraquinone disulfonic acid sodium salt, 2,7-anthraquinone disulfonic acid sodium salt, or ferulic acid, a plasma etching step of performing plasma etching on the wafer from the mask layer side using a fluorine-based stable gas as an etching gas, and forming grooves in the wafer along the projected dicing lines; and a mask layer removing step of removing the mask layer with cleaning water after the plasma etching step is performed, wherein the ultraviolet ray absorber absorbs ultraviolet rays emitted when the etching gas is plasmatized thereby to protect the devices from the ultraviolet rays.

2. The method of processing a wafer according to claim 1, wherein
the ultraviolet ray absorber includes fine particles of an oxide or a nitride.

3. The method of processing a wafer according to claim 1, wherein
the ultraviolet ray absorber includes a water-soluble ultraviolet ray absorber.

4. The method of processing a wafer according to claim 1, wherein
in the mask layer forming step, after the front face of the wafer is covered with the material, a laser beam having a wavelength that is absorbable by the wafer and the material is applied to the wafer along the projected dicing lines to remove the material along the projected dicing lines.

5. The method of processing a wafer according to claim 1, wherein
the devices comprise image sensors.

6. The method of processing a wafer according to claim 1, wherein the liquid resin comprises polyvinyl pyrrolidone or polyvinyl alcohol.

7. The method of processing a wafer according to claim 1, wherein the ultraviolet ray absorber further comprises fine particles of at least one metal oxide selected from titanium oxide ($TiO_2$), iron oxide (III) ($Fe_2O_3$), zinc oxide (ZnO), cerium oxide (IV) ($CeO_2$), copper oxide (I) ($Cu_2O$), copper oxide (II) (CuO), or magnesium oxide (MgO).

8. The method of processing a wafer according to claim 7, wherein the liquid resin is mixed with the at least one metal oxide and wherein a concentration of the at least one metal oxide with respect to the liquid resin is in a range of 1 to 10%.

9. The method of processing a wafer according to claim 1, wherein the ultraviolet ray absorber further comprises fine particles of at least one metal nitride selected from aluminum nitride (AlN), zirconium nitride (ZrN), hafnium nitride (HfN), hexagonal boron nitride (BN), or titanium nitride (TiN).

10. The method of processing a wafer according to claim 1 wherein the fluorine-based stable gas comprises at least one of sulfur hexafluoride ($SF_6$) or carbon tetrafluoride ($CF_4$), ethane hexafluoride ($C_2F_6$), tetrafloroethylene ($C_2F_4$), or trifluoromethane ($CHF_3$).

11. The method of processing a wafer according to claim 1, wherein the ultraviolet ray absorber comprises fine particles having an average diameter in a range of 10 to 50 nm.

12. A method of processing a wafer having devices disposed in respective regions demarcated on a front face thereof by a grid of a plurality of projected dicing lines on the front face, the method comprising:
a mask layer forming step of covering the front face of the wafer with a water-soluble protective film in which a water-soluble liquid resin is mixed with an ultraviolet ray absorber to form a mask layer on the front face of the wafer and removing the mask layer in regions where grooves are to be formed along projected dicing lines, using a laser beam having a wavelength that is absorbable by the wafer and the protective film, wherein the liquid resin comprises polyvinyl pyrrolidone;

a plasma etching step of performing plasma etching on the wafer from the mask layer side using a fluorine-based stable gas as an etching gas, and forming grooves in the wafer along the projected dicing lines; and a mask layer removing step of removing the mask layer with cleaning water after the plasma etching step is performed, wherein the ultraviolet ray absorber absorbs ultraviolet rays emitted when the etching gas is plasmatized thereby to protect the devices from the ultraviolet rays.

13. The method of processing a wafer according to claim 12, wherein the ultraviolet ray absorber comprises fine particles of at least one metal oxide selected from titanium oxide ($TiO_2$), iron oxide (III) ($Fe_2O_3$), zinc oxide (ZnO), cerium oxide (IV) ($CeO_2$), copper oxide (I) ($Cu_2O$), copper oxide (II) (CuO), or magnesium oxide (MgO), and wherein the fine particles have an average diameter in a range of 10 to 50 nm.

14. The method of processing a wafer according to claim 12, wherein the water-soluble liquid resin is mixed with at least one metal oxide and wherein a concentration of the metal oxide with respect to the liquid resin is in a range of 1 to 10%.

15. The method of processing a wafer according to claim 12, wherein the ultraviolet ray absorber comprises fine particles of at least one metal nitride selected from aluminum nitride (AlN), zirconium nitride (ZrN), hafnium nitride (HfN), hexagonal boron nitride (BN), or titanium nitride (TiN), and wherein the fine particles have an average diameter in a range of 10 to 50 nm.

16. The method of processing a wafer according to claim 12, wherein the ultraviolet ray absorber comprises at least one selected from 4,4'-dicarboxy benzophenone, benzophenone-4-carboxylic acid, 2-carboxy anthraquinone, 1,2-naphthalene dicarboxylic acid, 1,8-naphthalene dicarboxylic acid, 2,3-naphthalene dicarboxylic acid, 2,6-naphthalene dicarboxylic acid, 2,7-naphthalene dicarboxylic acid, salts thereof, 2,6-anthraquinone disulfonic acid sodium salt, 2,7-anthraquinone disulfonic acid sodium salt, or ferulic acid.

17. The method of processing a wafer according to claim 12 wherein the fluorine-based stable gas comprises at least one of sulfur hexafluoride ($SF_6$) or carbon tetrafluoride ($CF_4$), ethane hexafluoride ($C_2F_6$), tetrafluoroethylene ($C_2F_4$), or trifluoromethane ($CHF_3$).

* * * * *